(12) United States Patent
Tonomura et al.

(10) Patent No.: US 9,079,264 B2
(45) Date of Patent: Jul. 14, 2015

(54) CERAMIC SUBSTRATE, METHOD OF MANUFACTURING CERAMIC SUBSTRATE, AND METHOD OF MANUFACTURING POWER MODULE SUBSTRATE

(71) Applicant: MITSUBISHI MATERIALS CORPORATION, Tokyo (JP)

(72) Inventors: Hiroshi Tonomura, Naka-gun (JP); Takeshi Kitahara, Gotenba (JP); Hiroya Ishizuka, Koshigaya (JP); Yoshirou Kuromitsu, Saitama (JP); Yoshiyuki Nagatomo, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 23 days.

(21) Appl. No.: 13/867,439

(22) Filed: Apr. 22, 2013

(65) Prior Publication Data

US 2013/0232783 A1 Sep. 12, 2013

Related U.S. Application Data

(62) Division of application No. 12/734,428, filed as application No. PCT/JP2008/070219 on Nov. 6, 2008, now abandoned.

(30) Foreign Application Priority Data

| Nov. 6, 2007 | (JP) | 2007-288287 |
| Mar. 19, 2008 | (JP) | 2008-072509 |
| Oct. 21, 2008 | (JP) | 2008-271036 |
| Oct. 21, 2008 | (JP) | 2008-271037 |

(51) Int. Cl.
 B44C 1/22 (2006.01)
 B23K 1/20 (2006.01)
 (Continued)

(52) U.S. Cl.
 CPC ............... *B23K 1/20* (2013.01); *C04B 35/584* (2013.01); *C04B 37/026* (2013.01);
 (Continued)

(58) Field of Classification Search
 USPC ............................................. 216/13, 34, 35
 See application file for complete search history.

(56) References Cited

U.S. PATENT DOCUMENTS 5,176,893 A * 1/1993 Gerhold et al. ............... 423/344
5,268,069 A 12/1993 Chapple-Sokol et al.
(Continued)

FOREIGN PATENT DOCUMENTS

| JP | 02-107579 A | 4/1990 |
| JP | 04-046070 A | 2/1992 |

(Continued)

OTHER PUBLICATIONS

Bruls R J et al.: "A new estimation method for the intrinsic thermal conductivity of nonmetallic compounds—A case study for $MgSiN_2$, AlN and beta-$Si_3N_4$ ceramics", Journal of the European Ceramic Society, Elsevier Science Publishers, Barking, Essex, GB, vol. 25, No. 6, online: Jul. 4, 2004, pp. 767-779, XP004736452.

(Continued)

*Primary Examiner* — Shamim Ahmed
(74) *Attorney, Agent, or Firm* — Locke Lord LLP

(57) ABSTRACT

Disclosed is a ceramic substrate including silicon in which the concentration of a silicon oxide and a silicon composite oxide in the surface thereof is less than or equal to 2.7 Atom %.

10 Claims, 12 Drawing Sheets

(51) Int. Cl.
| | |
|---|---|
| *H01L 21/48* | (2006.01) |
| *H01L 23/15* | (2006.01) |
| *H01L 23/373* | (2006.01) |
| *H01L 23/40* | (2006.01) |
| *H01L 23/473* | (2006.01) |
| *H05K 3/38* | (2006.01) |
| *C04B 35/584* | (2006.01) |
| *C04B 37/02* | (2006.01) |
| *H05K 1/03* | (2006.01) |
| *H05K 3/00* | (2006.01) |

(52) U.S. Cl.
CPC ........... *H01L 21/4807* (2013.01); *H01L 23/15* (2013.01); *H01L 23/3735* (2013.01); *H01L 23/4006* (2013.01); *H01L 23/473* (2013.01); *H05K 3/381* (2013.01); *C04B 2235/72* (2013.01); *C04B 2235/721* (2013.01); *C04B 2235/723* (2013.01); *C04B 2235/96* (2013.01); *C04B 2237/121* (2013.01); *C04B 2237/128* (2013.01); *C04B 2237/368* (2013.01); *C04B 2237/402* (2013.01); *C04B 2237/52* (2013.01); *C04B 2237/704* (2013.01); *C04B 2237/706* (2013.01); *C04B 2237/86* (2013.01); *H01L 2224/32225* (2013.01); *H01L 2224/48227* (2013.01); *H01L 2924/1305* (2013.01); *H01L 2924/13055* (2013.01); *H05K 1/0306* (2013.01); *H05K 3/0029* (2013.01); *H05K 3/0052* (2013.01); *H05K 2201/0355* (2013.01); *H05K 2201/0909* (2013.01); *H05K 2201/09036* (2013.01); *H05K 2203/095* (2013.01); *Y10T 29/49155* (2015.01)

(56) References Cited

U.S. PATENT DOCUMENTS

| | | | | |
|---|---|---|---|---|
| 5,399,536 | A | | 3/1995 | Yamakawa et al. |
| 5,603,875 | A | * | 2/1997 | Giller et al. .................... 264/607 |
| 6,107,638 | A | | 8/2000 | Sumino et al. |
| 6,599,637 | B1 | | 7/2003 | Itoh et al. |
| 6,613,443 | B2 | | 9/2003 | Komatsu et al. |
| 6,620,743 | B2 | | 9/2003 | Pagliaro, Jr. et al. |
| 2002/0164475 | A1 | | 11/2002 | Imamura et al. |
| 2007/0023850 | A1 | * | 2/2007 | Chen et al. .................... 257/414 |
| 2007/0045801 | A1 | * | 3/2007 | Sugiyama et al. ............ 257/684 |
| 2008/0277841 | A1 | * | 11/2008 | Natsuhara et al. ............ 264/603 |

FOREIGN PATENT DOCUMENTS

| | | | | |
|---|---|---|---|---|
| JP | 04-295078 | A | | 10/1992 |
| JP | 07-335836 | A | | 12/1995 |
| JP | 10-130059 | A | | 5/1998 |
| JP | 10-1300059 | | * | 5/1998 |
| JP | 11-008216 | A | | 1/1999 |
| JP | 2002-009212 | A | | 1/2002 |
| JP | 2002-128567 | | * | 5/2002 |
| JP | 2002-128567 | A | | 5/2002 |
| JP | 2002-181776 | A | | 6/2002 |
| JP | 2003-031733 | | * | 1/2003 |
| JP | 2003-031733 | A | | 1/2003 |
| JP | 2004-231513 | A | | 8/2004 |
| JP | 2005-101164 | | * | 4/2005 |
| JP | 2005-101164 | A | | 4/2005 |
| JP | 2006-240955 | A | | 9/2006 |
| JP | 2007-088196 | A | | 4/2007 |
| JP | 2007-197229 | A | | 8/2007 |

OTHER PUBLICATIONS

Supplementary European Search Report dated Sep. 4, 2013, issued for the European patent application No. 08846400.3.
Notice of Reasons for Rejection mailed Mar. 19, 2013, issued for the Japanese patent application No. 2008-271036 and English translation thereof.
Notice of Reasons for Rejection mailed Mar. 19, 2013, issued for the Japanese patent application No. 2008-271037 and English translation thereof.
Office Action dated Jul. 10, 2012, issued for U.S. Appl. No. 12/734,428.
Office Action dated Aug. 24, 2012, issued for U.S. Appl. No. 12/734,428.
Office Action dated Jan. 22, 2013, issued for U.S. Appl. No. 12/734,428.
International Search Report dated Feb. 10, 2009, issued on PCT/JP2008/070219.
Japanese Office Action issued Jun. 19, 2012 in connection with Japanese Application No. 2008-072509.

* cited by examiner

| ELEMENT | I Atom% | II Atom% | III Atom% |
|---|---|---|---|
| C | 6.8 | 0 | 0 |
| N | 41.1 | 41.1 | 46.13 |
| O | 2.4 | 2.4 | 2.69 |
| Al | 0.05 | 0.05 | 0.056 |
| Y | 0.45 | 0.45 | 0.51 |
| Si | 43.6 | 43.6 | 48.93 |
| Au | 4.1 | 0 | 0 |
| Mg | 1.5 | 1.5 | 1.68 |
| Er | 0 | 0 | 0 |
| TOTAL | 100 | 89.1 | 100 |

(b)

| | Atom% |
|---|---|
| % of O in $Al_2O_3$ | 0.084 |
| % of O in $Y_2O_3$ | 0.76 |
| % of O in MgO | 1.68 |
| % of O in $Er_2O_3$ | 0 |
| TOTAL | 2.53 |
| % of O in $SiO_2$ | 0.168 |
| $SiO_2$ | 0.253 |

FIG. 5

| | FORMATION OF SCRIBE LINE | SURFACE TREATMENT | SILICON OXIDE CONCENTRATION |
|---|---|---|---|
| COMPARATIVE EXAMPLE 1 | CARBON DIOXIDE LAYER | NOT PERFORMED | 15.4 Atom% |
| COMPARATIVE EXAMPLE 2 | FIRST-HARMONIC-WAVE YAG LASER | NOT PERFORMED | 4.2 Atom% |
| EXAMPLE 1 | CARBON DIOXIDE LAYER | BLAST PROCESS | 1.2 Atom% |
| EXAMPLE 2 | FIRST-HARMONIC-WAVE YAG LASER | BLAST PROCESS | 0.9 Atom% |
| EXAMPLE 3 | SECOND-HARMONIC-WAVE YAG LASER | NOT PERFORMED | 1.9 Atom% |

| SILICON OXIDE CONCENTRATION | NUMBER OF THERMAL CYCLES | | | | | |
|---|---|---|---|---|---|---|
| | 1000 | 2000 | 3000 | 4000 | 5000 | 6000 |
| 0.90 Atom% | ○ | ○ | ○ | ○ | ○ | ○ |
| 1.24 Atom% | ○ | ○ | ○ | ○ | ○ | ○ |
| 1.89 Atom% | ○ | ○ | ○ | ○ | ○ | ○ |
| 2.67 Atom% | ○ | ○ | ○ | △ | △ | △ |
| 4.24 Atom% | △ | × | × | × | × | × |
| 15.43 Atom% | × | × | × | × | × | × |

|  | I | II | III |
|---|---|---|---|
| ELEMENT | Atom% | Atom% | Atom% |
| C | 5.534877 | 0 | 0 |
| N | 49.71131 | 49.71131 | 53.43246 |
| O | 2.251952 | 2.251952 | 2.420522 |
| Al | 0.057221 | 0.057221 | 0.061505 |
| Y | 0.958266 | 0.958266 | 1.029997 |
| Si | 39.15787 | 39.15787 | 42.08903 |
| Au | 1.429326 | 0 | 0 |
| Mg | 0.197145 | 0.197145 | 0.211902 |
| Er | 0.375399 | 0.375399 | 0.403499 |
| F | 0.326634 | 0.326634 | 0.351084 |
| TOTAL | 100 | 93.0358 | 100 |

(b)

|  | Atom% |
|---|---|
| % of O in $Al_2O_3$ | 0.086019 |
| % of O in $Y_2O_3$ | 1.440525 |
| % of O in MgO | 0.197573 |
| % of O in $Er_2O_3$ | 0.564323 |
| TOTAL | 2.28844 |
| % of O in $SiO_2$ | 0.132083 |
| $SiO_2$ | 0.198124 |

CERAMIC SUBSTRATE, METHOD OF MANUFACTURING CERAMIC SUBSTRATE, AND METHOD OF MANUFACTURING POWER MODULE SUBSTRATE

This application is a divisional application of U.S. application Ser. No. 12/734,428 filed Apr. 30, 2010 which is abandoned and which claims the right of priority under 35 U.S.C. §119 based on Japanese Patent Application Nos. 2007-288287, 2008-072509, 2008-271036 and 2008-271037 filed Nov. 6, 2007, Mar. 19, 2008, Oct. 21, 2008 and Oct. 21, 2008, respectively.

TECHNICAL FIELD

The present invention relates to a ceramic substrate, a method of manufacturing a ceramic substrate, and a method of manufacturing a power module substrate.

Priority is claimed on Japanese Patent Application No. 2007-288287, filed Nov. 6, 2007, Japanese Patent Application No. 2008-072509, filed Mar. 19, 2008, Japanese Patent Application No. 2008-271036, filed Oct. 21, 2008, and Japanese Patent Application No. 2008-271037, filed Oct. 21, 2008, the content of which is incorporated herein by reference.

BACKGROUND ART

For example, in general, a power module having an electronic part, such as a semiconductor chip, mounted thereon has a power module substrate including a ceramic substrate that is made of, for example, AlN (aluminum nitride) or $Al_2O_3$ (alumina), $Si_3N_4$ (silicon nitride), or SiC (silicon carbide), a circuit layer, which is a metal member provided on the upper surface of the ceramic substrate, and a metal layer, which is a metal member provided on the lower surface of the ceramic substrate. A semiconductor chip, which is a heating element, is provided on the circuit layer on the power module substrate, and a cooling heat sink is provided on the lower surface of the metal layer (see Patent Document 1).

In the power module, heat generated from the semiconductor chip is transferred to cooling water in the heat sink through the metal layer.

In the power module, when the ceramic substrate is made of $Si_3N_4$ that has mechanical characteristics better than those of AlN, for example, a bending strength higher than that of AlN, it is possible to reduce the thickness of the ceramic substrate.

[Patent Document 1] JP-A-2002-9212

DISCLOSURE OF INVENTION

Problems to be Solved by the Invention

When the metal member made of Al (aluminum) is bonded to the ceramic substrate made of $Si_3N_4$, a bonding defect is likely to occur between the ceramic substrate and the metal member.

For example, $SiO_2$ (silicon dioxide) or silicon composite oxide that is generated when the ceramic substrate is sintered exists in the surface of the ceramic substrate, and SiO (silicon monoxide) gas is generated from the silicon dioxide or the silicon composite oxide. The SiO gas hinders the bonding between the ceramic substrate and the metal member. In this case, there is a possibility that a sufficient bonding area between the ceramic substrate and the metal member will not be ensured. When the bonding defect occurs, the metal member is likely to peel off from the ceramic substrate during a thermal cycle (when heating is periodically repeated).

The present invention has been made in order to solve the above-mentioned problems and an object of the present invention is to provide a ceramic substrate capable of obtaining a sufficient bonding strength between the ceramic substrate including silicon and a metal member and improving the reliability of bonding during a thermal cycle, a method of manufacturing the ceramic substrate, and a method of manufacturing a power module substrate.

Means for Solving the Problem

According to an aspect of the present invention, there is provided a ceramic substrate including silicon, wherein the concentration of a silicon oxide and a silicon composite oxide in the surface of the ceramic substrate is less than or equal to 2.7 Atom %.

The concentration may be measured by an electron probe microanalyzer.

The ceramic substrate may be formed by dividing a ceramic base material including silicon along scribe lines that are formed in the surface of the ceramic base material.

According to the present invention, the concentration of the silicon oxide and the silicon composite oxide in the surface of the ceramic substrate is less than or equal to 2.7 Atom % and the generation of gas from the silicon oxide and the silicon composite oxide is prevented. Therefore, it is possible to obtain a sufficient bonding strength between the ceramic substrate and metal members. In this way, it is possible to improve the reliability of bonding during a thermal cycle.

The silicon oxide or the silicon composite oxide is formed in the surface of the ceramic substrate including silicon. When a metal member is bonded to the surface of the ceramic substrate, SiO gas generated from the silicon oxide or the silicon composite oxide, which hinders the bonding between the ceramic substrate and the metal member. As a result, it is difficult to ensure a sufficient contact area therebetween, which results in a bonding defect. When the concentration of the silicon oxide and the silicon composite oxide in the surface of the ceramic substrate is less than or equal to 2.7 Atom %, the generation of the SiO gas during bonding is prevented. In this way, it is possible to bond the metal member to the ceramic substrate with sufficient strength. As a result, it is possible to prevent the metal member from peeling off from the ceramic substrate.

According to another aspect of the present invention, there is provided a method of manufacturing a ceramic substrate. The method of manufacturing a ceramic substrate includes, radiating energy light to the surface of a ceramic base material including silicon to form scribe lines in the surface of the ceramic base material; and performing a surface treatment on the ceramic base material having the scribe lines formed therein. The concentration of a silicon oxide and a silicon composite oxide in the surface of the ceramic base material having the scribe lines formed therein is less than or equal to 2.7 Atom %.

According to still another aspect of the present invention, there is provided a method of manufacturing a power module substrate. The method of manufacturing a power module substrate includes, radiating energy light to the surface of a ceramic base material including silicon to form scribe lines in the surface of the ceramic base material, performing a surface treatment on the ceramic base material having the scribe lines formed therein, dividing the ceramic base material along the scribe lines to form a ceramic substrate, and bonding metal members to the ceramic substrate. The concentration of a silicon oxide and a silicon composite oxide in the surface of the ceramic base material having the scribe lines formed therein is less than or equal to 2.7 Atom %.

In the method of manufacturing the ceramic substrate and the method of manufacturing the power module substrate according to the above-mentioned aspects of the present invention, the concentration may be measured by an electron probe microanalyzer.

According to the present invention, the silicon oxide or the silicon composite oxide adhered to the surface of the ceramic substrate is removed by a surface treatment, when the scribe lines are formed. Therefore, it is possible to obtain sufficient bonding strength between the ceramic substrate and the metal member.

When the energy light is radiated to form the scribe lines, fumes of the silicon oxide or the silicon composite oxide are scattered from the ceramic base material and are adhered to the surface of the ceramic base material. Therefore, it is possible to remove the fumes from the surface of the ceramic base material by performing the surface treatment after the scribe lines are formed. In this way, when the metal member is bonded to the ceramic substrate, the generation of gas from the silicon oxide and the silicon composite oxide is prevented, and it is possible to bond the metal member to the ceramic substrate with sufficient strength. As a result, it is possible to prevent the metal member from peeling off from the ceramic substrate.

According to yet another aspect of the present invention, there is provided a method of manufacturing a ceramic substrate. The method of manufacturing a ceramic substrate includes radiating energy light with an energy that is greater than or equal to a second harmonic wave of a YAG laser to the surface of a ceramic base material including silicon to form scribe lines in the surface of the ceramic base material. The concentration of a silicon oxide and a silicon composite oxide in the surface of the ceramic base material having the scribe lines formed therein is less than or equal to 2.7 Atom %.

According to still yet another aspect of the present invention, there is provided a method of manufacturing a power module substrate. The method of manufacturing a power module substrate includes, radiating energy light with an energy that is greater than or equal to a second harmonic wave of a YAG laser to the surface of a ceramic base material including silicon, thereby forming scribe lines in the surface of the ceramic base material, dividing the ceramic base material along the scribe lines to form a ceramic substrate; and bonding metal members to the ceramic substrate. The concentration of a silicon oxide and a silicon composite oxide in the surface of the ceramic base material having the scribe lines formed therein is less than or equal to 2.7 Atom %.

In the method of manufacturing the ceramic substrate and the method of manufacturing the power module substrate according to the above-mentioned aspects of the present invention, the concentration may be measured by an electron probe microanalyzer.

According to the present invention, energy light with an energy that is greater than or equal to the second harmonic wave of the YAG laser is radiated to the surface of the ceramic base material to form the scribe lines in the surface of the ceramic base material. When the energy light with an energy that is greater than or equal to the second harmonic wave of the YAG laser is used, the influence of heat is reduced. Therefore, it is possible to prevent the generation of fumes when the scribe lines are formed. Even when the surface treatment step is omitted or simplified, it is possible to maintain the concentration of the silicon oxide and the silicon composite oxide in the surface of the ceramic base material to be less than or equal to 2.7 Atom %. In this way, when the metal member is bonded to the ceramic substrate, the generation of gas from the silicon oxide and the silicon composite oxide is prevented, and it is possible to bond the metal member to the ceramic substrate with sufficient strength. As a result, it is possible to prevent the metal member from peeling off from the ceramic substrate.

In the method of manufacturing the power module substrate according to the above-mentioned aspect of the present invention, the metal members may be made of aluminum. The metal members may be brazed to the ceramic substrate.

According to the present invention, when the metal member is bonded to the ceramic substrate, it is possible to prevent the generation of alumina and SiO gas. In this way, it is possible to bond the metal member to the ceramic substrate with sufficient strength.

During the bonding of the metal member to the ceramic substrate, when there is a silicon oxide or a silicon composite oxide in the surface of the ceramic substrate, SiO gas as well as alumina. Alumina is an aluminum oxide, and is generated at the interface between the metal member and the ceramic substrate and around the interface. Therefore, it is possible to prevent the generation of silicon monoxide gas when the metal member is bonded by removing the silicon oxide or the silicon composite oxide formed in the surface of the ceramic substrate using the surface treatment.

According to yet still another aspect of the present invention, there is provided a method of manufacturing a ceramic substrate. The method of manufacturing a ceramic substrate includes, sintering a ceramic base material including silicon; and performing a surface treatment on the ceramic base material. The concentration of a silicon oxide and a silicon composite oxide in the surface of the ceramic base material subjected to the surface treatment is less than or equal to 2.7 Atom %.

According to still yet another aspect of the present invention, there is provided a method of manufacturing a power module substrate. The method of manufacturing a power module substrate includes, sintering a ceramic base material including silicon, performing a surface treatment on the ceramic base material; and bonding metal members to a ceramic substrate that is obtained from the ceramic base material subjected to the surface treatment. The concentration of a silicon oxide and a silicon composite oxide in the surface of the ceramic base material subjected to the surface treatment is less than or equal to 2.7 Atom %.

In the method of manufacturing the ceramic substrate and the method of manufacturing the power module substrate according to the above-mentioned aspects of the present invention, the concentration may be measured by an electron probe microanalyzer.

According to the present invention, after the ceramic base material including Si is sintered, the surface treatment is performed on the ceramic base material to reduce the concentration of the silicon oxide and the silicon composite oxide in the surface of the ceramic base material to 2.7 Atom % or less. In this way, when the metal member is bonded to the ceramic substrate, the generation of gas from the silicon oxide and the silicon composite oxide is prevented, and it is possible to bond the metal member to the ceramic substrate with sufficient strength. As a result, it is possible to prevent the metal member from peeling off from the ceramic substrate.

In the method of manufacturing the ceramic substrate and the method of manufacturing the power module substrate according to the above-mentioned aspects of the present invention, the surface treatment may include dry etching using gas including fluoride ions. In addition, the gas may include at least one of a carbon fluoride and a nitrogen fluoride.

According to the present invention, after the ceramic base material is sintered, dry etching using gas including fluoride ions is performed as the surface treatment on the ceramic base material having the surface to which the silicon oxide and the silicon composite oxide are adhered, thereby reducing the concentration of the silicon oxide and the silicon composite oxide in the surface of the ceramic base material to 2.7 Atom % or less. That is, in the surface treatment step including dry etching, the silicon oxide and the silicon composite oxide in the surface of the ceramic base material react with fluoride ions to be changed into, for example, volatile $SiF_4$ (silicon tetrafluoride) gas and are then removed from the surface. In this way, when the metal member is bonded to the ceramic substrate, the generation of gas from the silicon oxide and the silicon composite oxide is prevented and it is possible to bond the metal member to the ceramic substrate with sufficient strength.

Since the fluoride ions included in a dry etching gas are changed into a volatile $SiF_4$ gas by the above-mentioned reaction, the fluoride ions do not remain as fluoride on the surface of the ceramic base material. In the dry etching, the circulation of reaction is less than when wet etching is performed on the ceramic base material. Therefore, it is possible to prevent the fluoride ions from reacting with an excessive amount of sintering agent and remaining as fluoride. In this way, when the metal member is bonded to the ceramic substrate, bonding defects do not occur due to the fluoride and it is possible to bond the metal member to the ceramic substrate with sufficient strength.

In the method of manufacturing the ceramic substrate and the method of manufacturing the power module substrate according to the above-mentioned aspects of the present invention, the surface treatment may include wet etching using an acid solution including fluoride ions.

According to the present invention, after the ceramic base material is sintered, wet etching using an acid solution including fluoride ions is performed as the surface treatment on the ceramic base material having the surface to which the silicon oxide and the silicon composite oxide are adhered. Thereby, the concentration of the silicon oxide and the silicon composite oxide in the surface of the ceramic base material is reduced to 2.7 Atom % or less. In this way, when the metal member is bonded to the ceramic substrate, the generation of gas from the silicon oxide and the silicon composite oxide is prevented and it is possible to bond the metal member to the ceramic substrate with sufficient strength.

In the method of manufacturing the power module substrate according to the above-mentioned aspect of the present invention, the metal members may be made of aluminum. The metal members may be brazed to the ceramic substrate.

According to the present invention, when the metal member is bonded to the ceramic substrate, it is possible to prevent the generation of alumina and SiO gas. In this way, it is possible to bond the metal member to the ceramic substrate with sufficient strength.

During the bonding of the metal member to the ceramic substrate, when there is a silicon oxide or a silicon composite oxide in the surface of the ceramic substrate, SiO gas as well as alumina, which is an aluminum oxide, is generated at the interface between the metal member and the ceramic substrate and around the interface. Therefore, it is possible to prevent the generation of silicon monoxide gas by removing the silicon oxide or the silicon composite oxide formed in the surface of the ceramic substrate using the surface treatment, when the metal member is bonded to the ceramic substrate.

After dry etching, there is no fluoride in the surface of the ceramic substrate. Therefore, the generation of $AlF_3$ (aluminum fluoride) in the surface is prevented, and the bonding strength between the ceramic substrate and the metal member is not reduced due to $AlF_3$. Therefore, sufficient bonding strength between the ceramic substrate and the metal member is ensured.

Operation of the Invention

According to the ceramic substrate, the method of manufacturing the ceramic substrate, and the method of manufacturing the power module substrate of the present invention, when the metal member is bonded to the ceramic substrate including silicon, the generation of SiO gas is prevented, and sufficient bonding strength between the ceramic substrate and the metal member is ensured. Therefore, it is possible to improve the reliability of the bonding between the ceramic substrate and the metal member during a thermal cycle. As a result, it is possible to prevent the metal member from peeling off from the ceramic substrate.

BRIEF DESCRIPTION OF THE DRAWINGS

FIG. 2 is a table illustrating the quantitative analysis result obtained by an EPMA in the first embodiment of the present invention.

FIG. 5 is a table illustrating the result of Example 1 in the first embodiment of the present invention.

FIG. 11 is a table illustrating the quantitative analysis result obtained by an EPMA in a fourth embodiment of the present invention.

REFERENCE NUMBER

Figure 1:
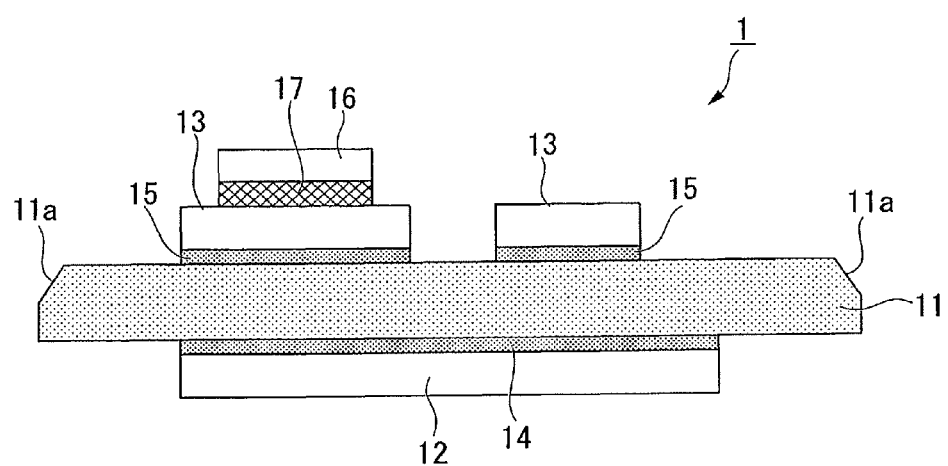
FIG. 1 is a cross-sectional view illustrating a power module substrate manufactured by a method of manufacturing a power module substrate according to a first embodiment of the present invention.

1: POWER MODULE SUBSTRATE
11, 41: CERAMIC SUBSTRATE

11a: CURVED SHOULDER PORTION
12: METAL LAYER (METAL MEMBER)
13: CIRCUIT LAYER (METAL MEMBER)
14, 15: BRAZING LAYER
16: ELECTRONIC PART
17, 34: SOLDER LAYER
20: CERAMIC BASE MATERIAL
21: SCRIBE LINE
22: FUME
30: POWER MODULE
31: COOLER
32: HEAT SINK
33: SCREW
101, 151: POWER MODULE SUBSTRATE
130: POWER MODULE
F: ETCHANT
G: GAS
L: LASER LIGHT
P: DRY ETCHING APPARATUS

BEST MODE FOR CARRYING OUT THE INVENTION

Hereinafter, a ceramic substrate, a method of manufacturing a ceramic substrate, and a method of manufacturing a power module substrate according to exemplary embodiments of the present invention will be described with reference to the accompanying drawings. In the drawings, the scale of each member is appropriately adjusted in order to have a recognizable size.
(First Embodiment)
A first embodiment of the present invention will be described with reference to FIGS. 1 to 6.

As shown in FIG. 1, a power module substrate 1 according to this embodiment includes a ceramic substrate 11, a metal layer (metal member) 12 that is provided on the lower surface of the ceramic substrate 11, and a plurality of circuit layers (metal members) 13 that is provided on the upper surface (one surface) of the ceramic substrate 11.

The ceramic substrate 11 is made of $Si_3N_4$ (silicon nitride) and has a plate shape. A curved shoulder portion 11a that is formed in a curved-line shape by a scribe line 21, which will be described below, is formed at the edge of the upper surface of the ceramic substrate 11. The concentration of a silicon oxide and a silicon composite oxide in the upper and lower surfaces of the ceramic substrate 11 is measured by an EPMA (electron probe microanalyzer). As a result, the concentration is less than or equal to 2.7 Atom %.

The surface measurement method using the EPMA will be described with reference to FIG. 2. The quantitative analysis result shown in each table of FIG. 2 is just an illustrative example for describing the surface measurement method.

In this embodiment, JXA-8600 manufactured by JEOL LTD. is used, and the measurement is performed under the conditions of an operation pressure of $1.3 \times 10^{-3}$ Pa, an acceleration voltage of 15.0 kV, and a probe current of $5.0 \times 10^{-8}$ A. An Au film with a thickness of less than 100 nm is formed on the surface of the ceramic substrate 11 by vapor deposition.

First, the surface of the ceramic substrate 11 is quantitatively analyzed under the above-mentioned conditions (an item I of Table (a) in FIG. 2). Then, among the elements detected by the quantitative analysis, the detection amount of C (carbon) and Au (gold) is set to 0 (an item II of Table (a) in FIG. 2). The detection amount of elements other than C and Au is converted such that the sum thereof is 100 Atom % (an item III of Table (a) in FIG. 2).

Then, assuming that metal elements other than Si (silicon) exist as the most common oxides (for example, $Al_2O_3$ (alumina), $Y_2O_3$ (yttrium oxide), MgO (magnesium oxide), and $Er_2O_3$ (erbium oxide)), the atomic weight of O (oxygen) coupled to the metal elements other than Si is calculated (Table (b) of FIG. 2).

Then, the difference between the converted atomic weight of O and the atomic weight of O coupled to the metal elements other than Si is calculated. It is assumed that the calculated total amount of O is coupled to Si to form $SiO_2$, and a value obtained by multiplying the calculated atomic weight of O by 1.5 is used as the concentration of $SiO_2$ in the surface of the ceramic substrate 11. For example, in the quantitative analysis result shown in FIG. 2, $SiO_2$ concentration is 0.253 Atom %.

The surface measurement using the EPMA is performed at any five points on the upper surface of the ceramic substrate 11. In this embodiment, the surface measurement is performed at five points, but the present invention is not limited thereto. For example, the surface measurement may be performed at ten points or other multiple points.

The metal layer 12 is made of a metal material having high thermal conductivity, such as Al (aluminum), and is bonded to the ceramic substrate 11 by a brazing layer 14.

The circuit layers 13 are made of a metal material having high thermal conductivity, such as Al, similar to the metal layer 12, and are arranged at a predetermined interval to form a circuit. The circuit layers 13 are bonded to the ceramic substrate 11 by a brazing layer 15.

An electronic part 16 is fixed to the upper surface of the circuit layer 13 by a solder layer 17. For example, a power device, such as an IGBT (Insulated Gate Bipolar Transistor), is given as an example of the electronic part 16.

Next, a method of manufacturing the power module substrate 1 will be described with reference to FIG. 3.

Figure 3:
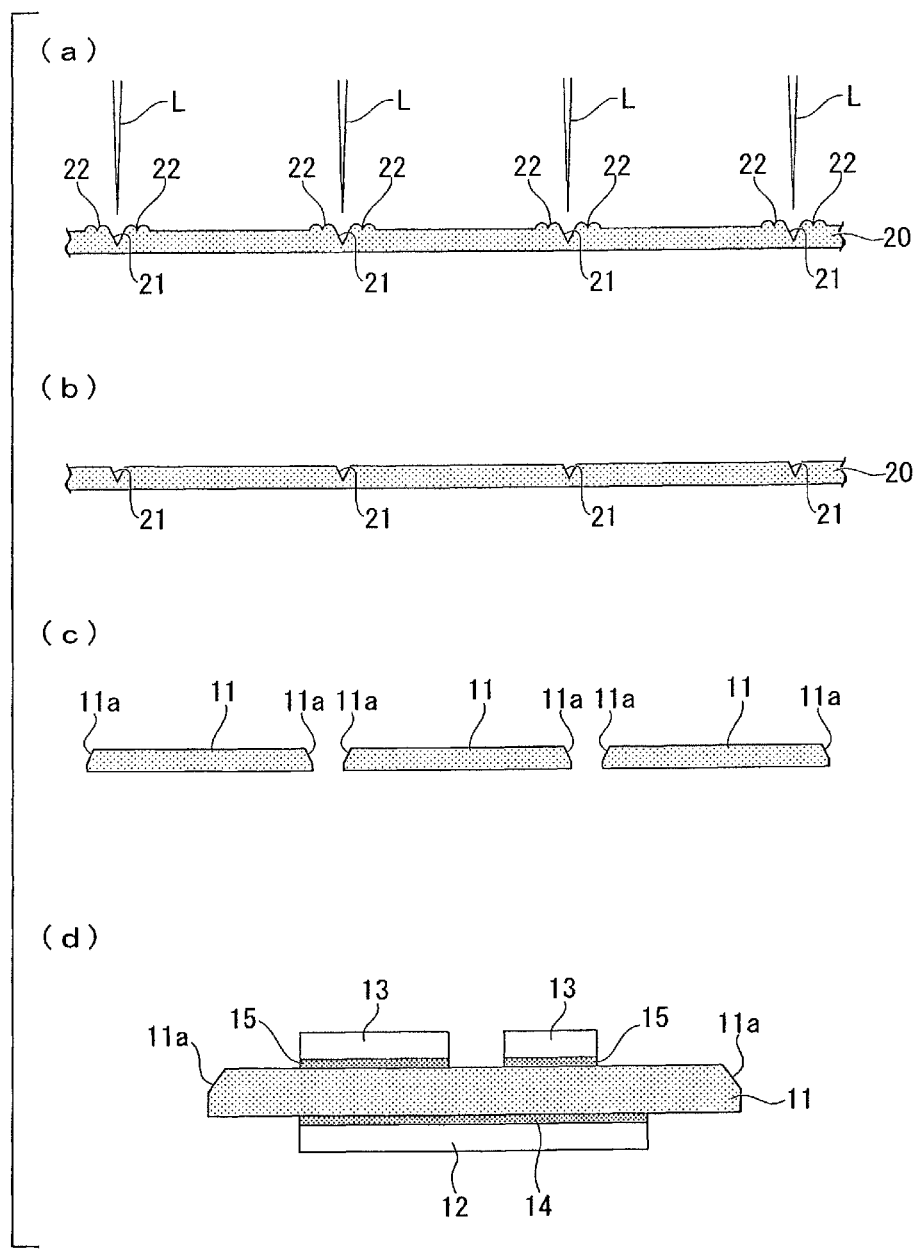
FIG. 3 is a process diagram illustrating the method of manufacturing the power module substrate according to the first embodiment of the present invention.

First, the scribe lines 21 are formed in one surface of a ceramic base material 20 made of $Si_3N_4$ (Step (a) of FIG. 3). In this embodiment, laser light (energy light) L is radiated to one surface of the ceramic base material 20 to form the linear scribe lines 21. In this case, fumes 22 scattered from the ceramic base material 20 by the radiation of the laser light L are adhered to regions in which the scribe lines 21 are formed and around the regions. The fume 22 is made of a silicon oxide and a silicon composite oxide since the ceramic base material 20 is made of $Si_3N_4$. When laser light with an energy that is greater than or equal to a second harmonic wave (for example, a second harmonic wave, a third harmonic wave, or a fourth harmonic wave) of a YAG laser is used, the influence of heat is reduced, and it is possible to reduce the amount of fume 22 scattered from the ceramic base material 20.

Then, a surface treatment is performed on the ceramic base material 20 (Step (b) of FIG. 3). In this case, a blast process of blowing $ZrO_2$ (zirconium dioxide) powder to the upper and lower surfaces of the ceramic base material 20 is performed. In this way, the upper and lower surfaces of the ceramic base material 20 are planarized, and the fumes 22 adhered to one surface of the ceramic base material 20 are removed. When laser light with an energy that is greater than or equal to a second harmonic wave (for example, a second harmonic wave, a third harmonic wave, or a fourth harmonic wave) of a YAG laser is used to form the scribe lines 21, the amount of fume 22 generated is small. The surface treatment may be omitted. Alternatively, for example, a simple etching process may be used as the surface treatment.

In this case, the concentration of a silicon oxide and a silicon composite oxide in the upper and lower surfaces of the ceramic base material 20 is measured by the EPMA. As a result, the concentration is less than or equal to 2.7 Atom %. The surface measurement using the EPMA is performed in the same way as described above. The surface measurement using the EPMA is performed at any five points in each of a plurality of regions partitioned by the scribe lines 21 in the ceramic base material 20.

Then, the ceramic base material 20 is divided along the scribe lines 21 (Step (c) of FIG. 3). In this way, the ceramic substrate 11 is manufactured. The metal layer 12 and the circuit layer 13 are bonded to the upper and lower surfaces of the ceramic substrate 11 manufactured in this way by brazing (Step (d) of FIG. 3).

In this way, the power module substrate 1 is manufactured.

A surface treatment is performed to remove the silicon oxide and the silicon composite oxide from the upper and lower surfaces of the ceramic substrate 11. Therefore, when metal members, such as the metal layer 12 and the circuit layer 13, are bonded to the ceramic substrate 11, the generation of SiO gas from the silicon oxide and the silicon composite oxide is prevented. In this way, it is possible to sufficiently ensure the bonding area of the circuit layer 13 to the ceramic substrate 11 and the bonding area of the metal layer 12 to the ceramic substrate 11. Therefore, it is possible to improve the reliability of the bonding between the ceramic substrate and the metal members during a thermal cycle. As a result, it is possible to prevent the metal members from peeling off from the ceramic substrate.

In the power module substrate 1, the bonding area of the circuit layer 13 to the ceramic substrate 11 and the bonding area of the metal layer 12 to the ceramic substrate 11 are sufficiently ensured. Therefore, during the temperature cycle test, even when a load of about 1000 cycles is applied, the peeling-off of a metal member, such as the metal layer 12 or the circuit layer 13, from the ceramic substrate 11 is prevented.

Figure 4:
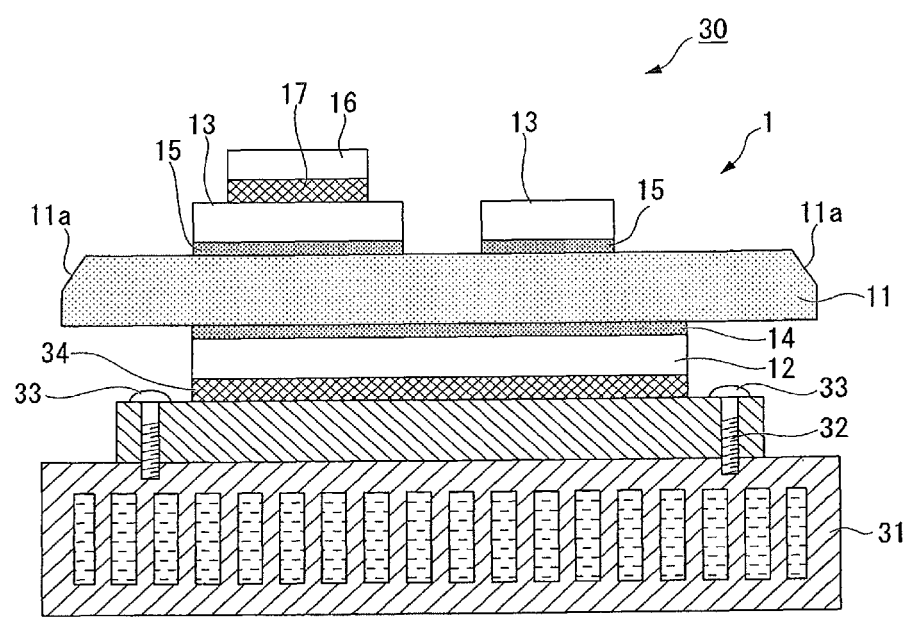
FIG. 4 is a cross-sectional view illustrating a power module including the power module substrate shown in FIG. 1 in the first embodiment of the present invention.

For example, the power module substrate 1 manufactured in this way is used in a power module 30 shown in FIG. 4. The power module 30 includes the power module substrate 1, an electronic part 16, a cooler 31, and a radiator plate 32.

The cooler 31 is a water-cooled heat sink and has a flow path through which cooling water, which is a cooling medium, flows formed therein.

The radiator plate 32 has a plate having a substantially rectangular shape in a plan view and is made of, for example, Al or Cu (copper), AlSiC (aluminum silicon carbide), or Cu—Mo (molybdenum). The radiator plate 32 is fixed to the cooler 31 by screws 33 with, for example, heat conductive grease interposed therebetween.

The radiator plate 32 and the metal layer 12 of the power module substrate 1 are bonded to each other by a solder layer 34. The radiator plate 32 and the metal layer 12 may be bonded to each other by brazing. In this case, when the power module substrate 1 is manufactured, the members may be collectively brazed, with the radiator plate 32 stacked on the laminate of the metal layer 12, the ceramic substrate 11, and the circuit layer 13. In the power module 30, the power module substrate 1 may be provided on the upper surface of the cooler 31, without providing the radiator plate 32.

According to the ceramic substrate 11, the method of manufacturing the ceramic substrate 11, and the method of manufacturing the power module substrate 1, since the surface treatment is performed after the scribe lines 21 are formed, it is possible to sufficiently ensure the bonding area of the circuit layer 13 to the ceramic substrate 11 and the bonding area of the metal layer 12 to the ceramic substrate 11. Therefore, it is possible to improve the reliability of the bonding between the ceramic substrate and the metal members during a thermal cycle. As a result, it is possible to prevent the metal members from peeling off from the ceramic substrate.

The present invention is not limited to the above-described embodiment, but various modifications and changes of the present invention can be made without departing from the scope of the present invention.

For example, the circuit layer is bonded to the upper surface of the ceramic substrate to which the laser light L is radiated. However, the metal layer may be bonded to the lower surface of the ceramic substrate to which the laser light L is radiated. The ceramic substrate and the circuit layer or the metal layer are bonded to each other by brazing. However, they may be bonded to each other by other methods.

The concentration of the silicon oxide and the silicon composite oxide in the upper and lower surfaces of the ceramic substrate is less than or equal to 2.7 Atom %. However, the concentration of the silicon oxide and the silicon composite oxide in one surface of the ceramic substrate on which at least the scribe lines are formed may be less than or equal to 2.7 Atom %.

The ceramic base material is divided to form the ceramic substrate and the metal layer and the circuit layer are bonded to the ceramic substrate. However, at least one of the metal layer and the circuit layer may be bonded to the ceramic base material having the scribe lines formed therein and the ceramic base material may be divided to form the ceramic substrate.

The scribe lines are formed by the radiation of laser light. However, the scribe lines may be formed by the radiation of other kinds of energy light.

As the surface treatment, for example, a honing process or a wet etching process other than the blast process of blowing powder may be performed.

Each of the metal layer and the circuit layer is made of aluminum, but it may be made of other metal materials.

In the power module substrate, the metal layer is bonded to the lower surface of the ceramic substrate. However, the radiator plate or the cooler may be directly bonded to the lower surface of the ceramic substrate without providing the metal layer. The cooler is not limited to the water-cooled type, but may be another liquid-cooled type or an air-cooled type.

Example 1

Hereinafter, the results of a comparative test for verifying the effects of the first embodiment of the present invention will be described.

In Example 1 of the present invention, a carbon dioxide laser was used in the scribe line forming step, and a blast process of blowing $ZrO_2$ (zirconium dioxide) powder to the surface of the ceramic substrate was performed.

In Example 2 of the present invention, a first-harmonic-wave YAG laser was used in the scribe line forming step and a blast process of blowing $ZrO_2$ (zirconium dioxide) powder to the surface of the ceramic substrate was performed.

In Example 3 of the present invention, a second-harmonic-wave YAG laser was used in the scribe line forming step and no surface treatment was performed.

In Comparative example 1, a carbon dioxide laser was used in the scribe line forming step, and no surface treatment was performed.

In Comparative example 2, a first-harmonic-wave YAG laser was used in the scribe line forming step, and no surface treatment was performed.

The concentrations of a silicon oxide and a silicon composite oxide in the surfaces of the ceramic substrates obtained from Examples 1, 2, and 3 and Comparative examples 1 and 2 were quantitatively evaluated by surface measurement using the EPMA (electron probe microanalyzer). The evaluation results are shown in FIG. 5.

In Comparative example 1 in the carbon dioxide laser was used to form the scribe lines and no surface treatment was performed, the concentration of the silicon oxide and the silicon composite oxide was 15.4 Atom %. However, in Example 1 of the present invention in which the blast process was performed after the scribe lines were formed, the concentration of the silicon oxide and the silicon composite oxide was 1.2 Atom %.

In Comparative example 2 in which the YAG laser was used to form the scribe lines and no surface treatment was performed, the concentration of the silicon oxide and the silicon composite oxide was 4.2 Atom %. However, in Example 2 of the present invention in which the blast process was performed after the scribe lines were formed, the concentration of the silicon oxide and the silicon composite oxide was 0.9 Atom %.

In Example 3 of the present invention in which the second-harmonic-wave YAG laser was used to form the scribe lines and no surface treatment was performed, even though the surface treatment was not performed, the concentration of the silicon oxide and the silicon composite oxide was 1.9 Atom %.

The above-mentioned results proved that, even when fumes were generated during the formation of the scribe lines by the carbon dioxide laser or the YAG laser, it was possible to reduce the concentration of the silicon oxide and the silicon composite oxide by performing a surface treatment, such as the blast process.

In addition, the above-mentioned results proved that, when the second-harmonic-wave YAG laser was used, the generation of fumes was prevented, and even when the surface treatment was omitted, it was possible to obtain a ceramic substrate in which the concentration of the silicon oxide and the silicon composite oxide was less than or equal to 2.7 Atom %.

Example 2

Next, the test results of the relationship between the concentration of the silicon oxide and the silicon composite oxide in the surface of the ceramic substrate and the reliability of bonding when a metal plate is bonded to the surface of the ceramic substrate will be described.

An aluminum plate (with a size of 27 mm×27 mm and a thickness of 0.6 mm) is brazed to a ceramic substrate (a size of 30 mm×30 mm and a thickness of 0.32 mm) with a variable concentration of a silicon oxide and a silicon composite oxide in the surface thereof by Al—Si-based brazing filler metal.

Figures 6, 7:
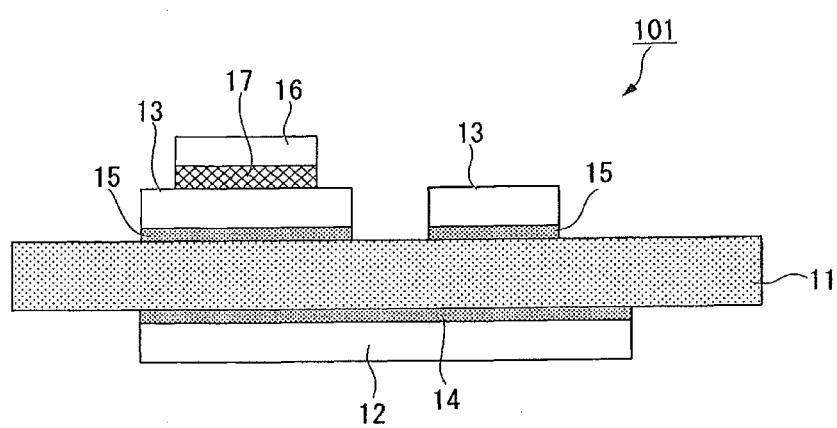
FIG. 6 is a table illustrating the result of Example 2 in the first embodiment of the present invention.
FIG. 7 is a cross-sectional view illustrating a power module substrate according to a second embodiment of the present invention.

The laminate of the ceramic substrate and the aluminum plate bonded to each other was repeatedly heated and cooled at a temperature of 105° C. and (−40° C.) and the bonding state was evaluated. The evaluation result is shown in FIG. 6. In FIG. 6, an item represented by O indicates that the peeling rate is less than 15%, an item represented by Δ indicates the peeling rate is greater than or equal to 15% and less than 30%, and an item represented by x indicates that the peeling rate is greater than or equal to 30%. The peeling rate means the ratio of the peeling area to an initial bonding area (peeling area/initial bonding area). The initial bonding area indicates the area of the plate to be bonded before bonding.

It was found that, when the concentration of the silicon oxide and the silicon composite oxide in the surface of the ceramic substrate was less than or equal to 2.7 Atom %, the bonding strength between the aluminum plate and the ceramic substrate was sufficiently high even when a 3000-cycle load was applied. In particular, it was found that, when the concentration of the silicon oxide and the silicon composite oxide in the surface of the ceramic substrate was less than or equal to 2.0 Atom %, the aluminum plate and the ceramic substrate were strongly bonded to each other even when a 6000-cycle load was applied.

On the other hand, it was found that, when the concentration of the silicon oxide and the silicon composite oxide in the surface of the ceramic substrate was more than 2.7 Atom %, peeling off of the aluminum plate was observed when a 1000-cycle load was applied.

The above-mentioned results proved that, when the concentration of the silicon oxide and the silicon composite oxide in the surface of the ceramic substrate was less than or equal to 2.7 Atom %, the generation of silicon monoxide gas was prevented during bonding and it was possible to bond the ceramic substrate and the metal member with sufficiently high strength.

(Second Embodiment)

Figure 8:
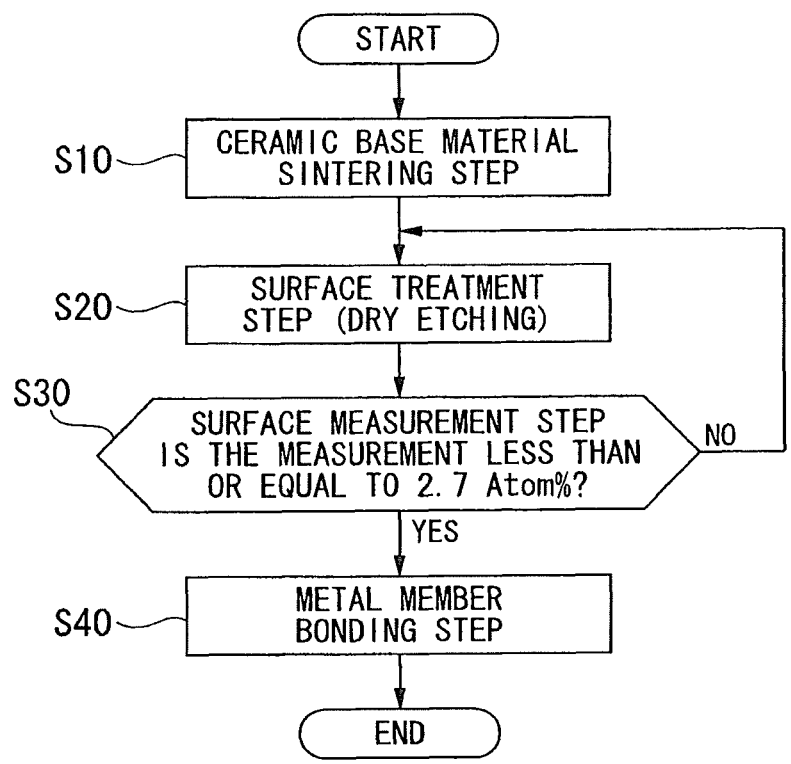
FIG. 8 is a flowchart illustrating a method of manufacturing the power module substrate according to the second embodiment of the present invention.

A second embodiment of the present invention will be described with reference to FIGS. 7 to 9. In the second embodiment, the same members as those in the first embodiment are denoted by the same reference numerals, and a description thereof will be omitted.

As shown in FIG. 7, a power module substrate 101 according to this embodiment includes a ceramic substrate 11, a metal layer (metal member) 12 that is provided on the lower surface of the ceramic substrate 11, and a plurality of circuit layers (metal members) 13 that is provided on the upper surface of the ceramic substrate 11.

The ceramic substrate 11 is made of $Si_3N_4$ (silicon nitride) and has a plate shape. The concentration of a silicon oxide and a silicon composite oxide in the upper and lower surfaces of the ceramic substrate 11 is measured by an EPMA (electron probe microanalyzer). As a result, the concentration is less than or equal to 2.7 Atom %. A surface measurement method using the EPMA according to this embodiment is the same as that described with reference to FIG. 2 in the first embodiment, and thus a description thereof will be omitted in this embodiment.

Next, a method of manufacturing the power module substrate 101 will be described with reference to FIG. 8.

First, a ceramic base material which is made of $Si_3N_4$, is a base of the ceramic substrate 11, and has substantially the same shape as the ceramic substrate 11 is prepared, and the ceramic base material is burned (sintered) (sintering step; S10). A silicon (Si) oxide and silicon composite oxide generated during the sintering exist in the surface of the sintered ceramic base material.

Then, plasma etching or reactive ion etching is performed on the surface of the ceramic base material using gas including fluoride ions (surface treatment step; S20). The plasma etching or the reactive ion etching is so-called dry etching. The gas used in the surface treatment step is a mixture of a main gas, a sub-gas, and a carrier gas. Specifically, the main gas is at least one of carbon fluoride (for example, $C_nF_{2n+2}$ or $C_nF_{2n}$) and nitrogen fluoride (for example, $NF_3$). The sub-gas is $H_2$, $SF_6$ (sulfur hexafluoride), or a rare gas. The carrier gas is $Ar^+$, $Ne^+$, or $He^+$ (as ion beams).

When $H_2$ is used as the sub-gas, it is possible to reliably increase the etching rate ratio of $SiO_2$. When $SF_6$ is used as the sub-gas, $SF_5^+$ serves as the carrier gas. When a rare gas is used as the sub-gas, the fluorine concentration of the gas is reduced and it is possible to increase the etching rate ratio of $SiO_2$.

In the surface treatment step, $SiO_2$ in the surface of the ceramic base material reacts with the gas to be mainly changed into $SiF_4$ and NOx or COx and is then removed from the surface of the gasificated ceramic base material. As such, the silicon oxide and the silicon composite oxide in the surface of the ceramic base material are removed with high accuracy.

When hydrogen is included in the gas, $NH_4F$ or $(NH_4)_2SiF_6$ is formed in the surface of the ceramic base material. It is preferable that the $NH_4F$ or $(NH_4)_2SiF_6$ be removed in the next step.

Although not shown in the drawings, after the surface treatment step, it is preferable that the ceramic base material be cleaned in a distilled water cleaning step, dried by an air blower in a drying step, and cleaned in an ultrasonic cleaning step using ethanol.

Then, after the surface treatment step, the concentration of the silicon oxide and the silicon composite oxide in the surface of the ceramic base material is measured by the EPMA. As a result, the concentration is less than or equal to 2.7 Atom % (surface measurement step; S30). The surface measurement method using the EPMA is the same as described above. The surface measurement using the EPMA is performed at any five points on the surface of the ceramic base material.

If the result of the surface measurement step is less than or equal to 2.7 Atom %, the manufacture of the ceramic substrate 11 ends, and the process proceeds to the next step. If the result of the surface measurement step is more than 2.7 Atom %, the surface treatment step is performed on the ceramic base material again.

Then, the circuit layer 13 is bonded to the upper surface of the ceramic substrate 11 by brazing and the metal layer 12 is bonded to the lower surface of the ceramic substrate 11 by brazing (metal member bonding step; S40).

In this way, the power module substrate 101 is manufactured.

According to the method of manufacturing the power module substrate 101, the silicon oxide and the silicon composite oxide are removed from the upper and lower surfaces of the ceramic substrate 11 of the power module substrate 101 by dry etching in the surface treatment step. Therefore, when metal members, such as the metal layer 12 and the circuit layer 13, are bonded to the ceramic substrate 11, the generation of SiO gas from the silicon oxide and the silicon composite oxide is prevented. That is, the silicon oxide and the silicon composite oxide in the surface of the ceramic base material react with fluoride ions during dry etching to change into a volatile $SiF_4$ gas and are then removed from the surface. Therefore, the concentration of the silicon oxide and the silicon composite oxide in the surface measured by the surface measurement is reliably reduced to 2.7 Atom % or less. When the metal members are bonded to the ceramic substrate 11, the generation of SiO gas from the silicon oxide and the silicon composite oxide is prevented. In this way, the bonding area of the circuit layer 13 to the ceramic substrate 11 and the bonding area of the metal layer 12 to the ceramic substrate 11 are sufficiently ensured. Therefore, it is possible to improve the reliability of the bonding between the ceramic substrate and the metal members during a thermal cycle. As a result, it is possible to prevent the metal members from peeling off from the ceramic substrate.

Since the fluoride ions included in a dry etching gas are changed into a volatile $SiF_4$ gas by the above-mentioned reaction, the fluoride ions do not remain as fluoride on the surface of the ceramic base material. In the dry etching, the circulation of reaction is less than that in the wet etching of the ceramic base material. Therefore, it is possible to prevent the fluoride ions from reacting with an excessive amount of sintering agent and from remaining as fluoride.

In the dry etching, $SiO_2$ in the surface of the ceramic base material is removed by etching. When the ceramic base material is changed to $Si_3N_4$, an etching reaction is prevented. Therefore, it is possible to effectively remove only $SiO_2$.

Therefore, when the metal members are bonded to the ceramic substrate 11, a bonding defect caused by fluoride is prevented, and the reliability of the bonding between the ceramic substrate 11 and the metal members is reliably improved.

When the metal members are bonded to the ceramic substrate 11, the generation of $Al_2O_3$ and SiO gas is prevented. Therefore it is possible to bond the ceramic substrate 11 and the metal members with sufficiently high strength. That is, during the bonding of the metal layer 12 or the circuit layer 13 including aluminum to the ceramic substrate 11, when there is silicon oxide or silicon composite oxide in the surface of the ceramic substrate 11, silicon monoxide gas as well as alumina, which is an aluminum oxide, is generated at the interface between the metal member and the ceramic substrate 11 and around the interface. However, since the silicon oxide and the silicon composite oxide in the surface of the ceramic substrate 11 are effectively removed by the surface treatment, the generation of silicon monoxide gas during bonding is prevented.

Since no fluoride remains on the surface of the ceramic substrate 11 after dry etching, the generation of $AlF_3$ (aluminum fluoride) from the surface is prevented, and there is no reduction in the bonding strength between the ceramic substrate 11 and the metal member due to $AlF_3$. Therefore, the bonding strength between the ceramic substrate 11 and the metal member is sufficiently ensured.

The surface measurement step may be omitted when the measurement result thereof is stable and is less than or equal to 2.7 Atom %.

It is more preferable that the surface treatment step be performed immediately before the metal member bonding step.

If the result of the surface measurement step is more than 2.7 Atom %, as described above, the ceramic base material may be discarded without performing the surface treatment step on the ceramic base material again. That is, it is possible to select the use of ceramic members according to various conditions and purposes.

In the power module substrate 101, the bonding area of the circuit layer 13 to the ceramic substrate 11 and the bonding area of the metal layer 12 to the ceramic substrate 11 are sufficiently ensured. Therefore, during the temperature cycle test, for example, even when a load of about 1000 cycles is applied, the peeling-off of a metal member, such as the metal layer 12 or the circuit layer 13, from the ceramic substrate 11 is prevented.

Figure 9:
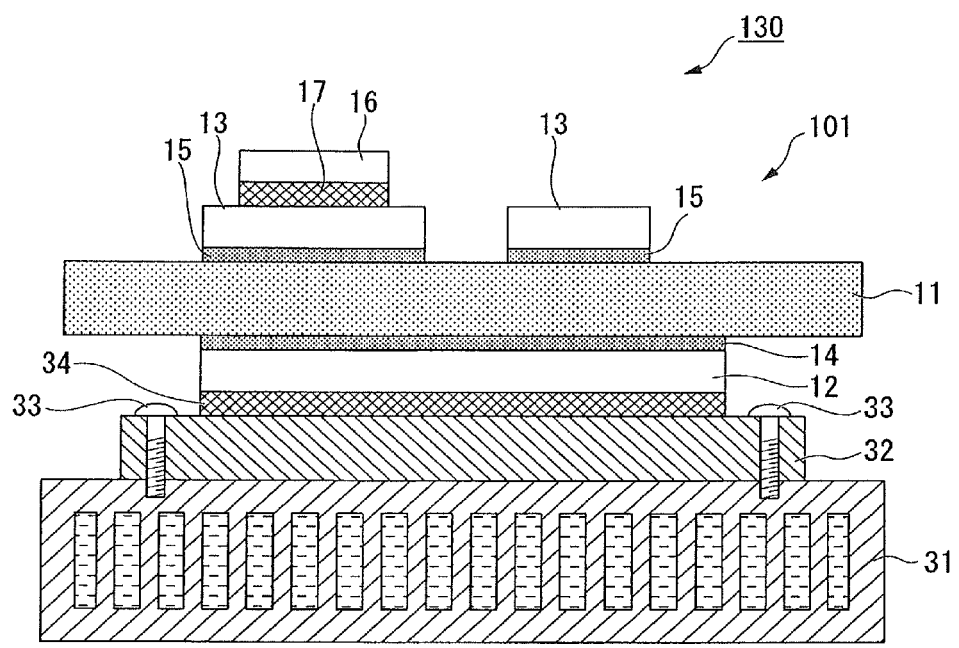
FIG. 9 is a cross-sectional view illustrating a power module including the power module substrate shown in FIG. 7 in the second embodiment of the present invention.

For example, the power module substrate 101 manufactured in this way is used in a power module 130 shown in FIG. 9. The power module 130 includes the power module substrate 101, an electronic part 16, a cooler 31, and a radiator plate 32.

The cooler 31 is a water-cooled heat sink and has a flow path through which cooling water, which is a cooling medium, flows formed therein.

The radiator plate 32 has a plate having a substantially rectangular shape in a plan view and is made of, for example, Al or Cu (copper), AlSiC (aluminum silicon carbide), or Cu—Mo (molybdenum). The radiator plate 32 is fixed to the cooler 31 by screws 33 with, for example, heat conductive grease interposed therebetween.

The radiator plate 32 and the metal layer 12 of the power module substrate 101 are bonded to each other by a solder layer 34. The radiator plate 32 and the metal layer 12 may be bonded to each other by brazing. In this case, when the power module substrate 101 is manufactured, the members may be collectively brazed, with the radiator plate 32 stacked on the laminate of the metal layer 12, the ceramic substrate 11, and the circuit layer 13. In the power module 130, the power module substrate 101 may be provided on the upper surface of the cooler 31, without providing the radiator plate 32.

According to the ceramic substrate 11, the method of manufacturing the ceramic substrate 11, and the method of manufacturing the power module substrate 101, since dry etching is performed on the sintered ceramic base material, it is possible to sufficiently ensure the bonding area of the circuit layer 13 to the ceramic substrate 11 and the bonding area of the metal layer 12 to the ceramic substrate 11. Therefore, it is possible to improve the reliability of the bonding between the ceramic substrate and the metal members during a thermal cycle. As a result, it is possible to prevent the metal members from peeling off from the ceramic substrate.

(Third Embodiment)

A third embodiment of the present invention will be described with reference to FIG. 10. In the third embodiment, the same members as those in the above-described embodiments are denoted by the same reference numeral and a description thereof will be omitted.

First, a burned (sintered) ceramic base material 20 that is made of $Si_3N_4$ is prepared. A silicon oxide and silicon composite oxide including Si generated during sintering exist in the surface of the ceramic base material 20. A plurality of scribe lines 21 is formed in one surface of the ceramic base material 20 (Step (a) of FIG. 10).

Laser light (energy light) L is radiated to one surface of the ceramic base material 20 to form the linear scribe lines 21. In this case, fumes 22 scattered from the ceramic base material 20 by the radiation of the laser light L are adhered to regions in which the scribe lines 21 are formed and around the regions. The fume 22 is also a silicon oxide and a silicon composite oxide since the ceramic base material 20 is made of $Si_3N_4$.

Figure 10:
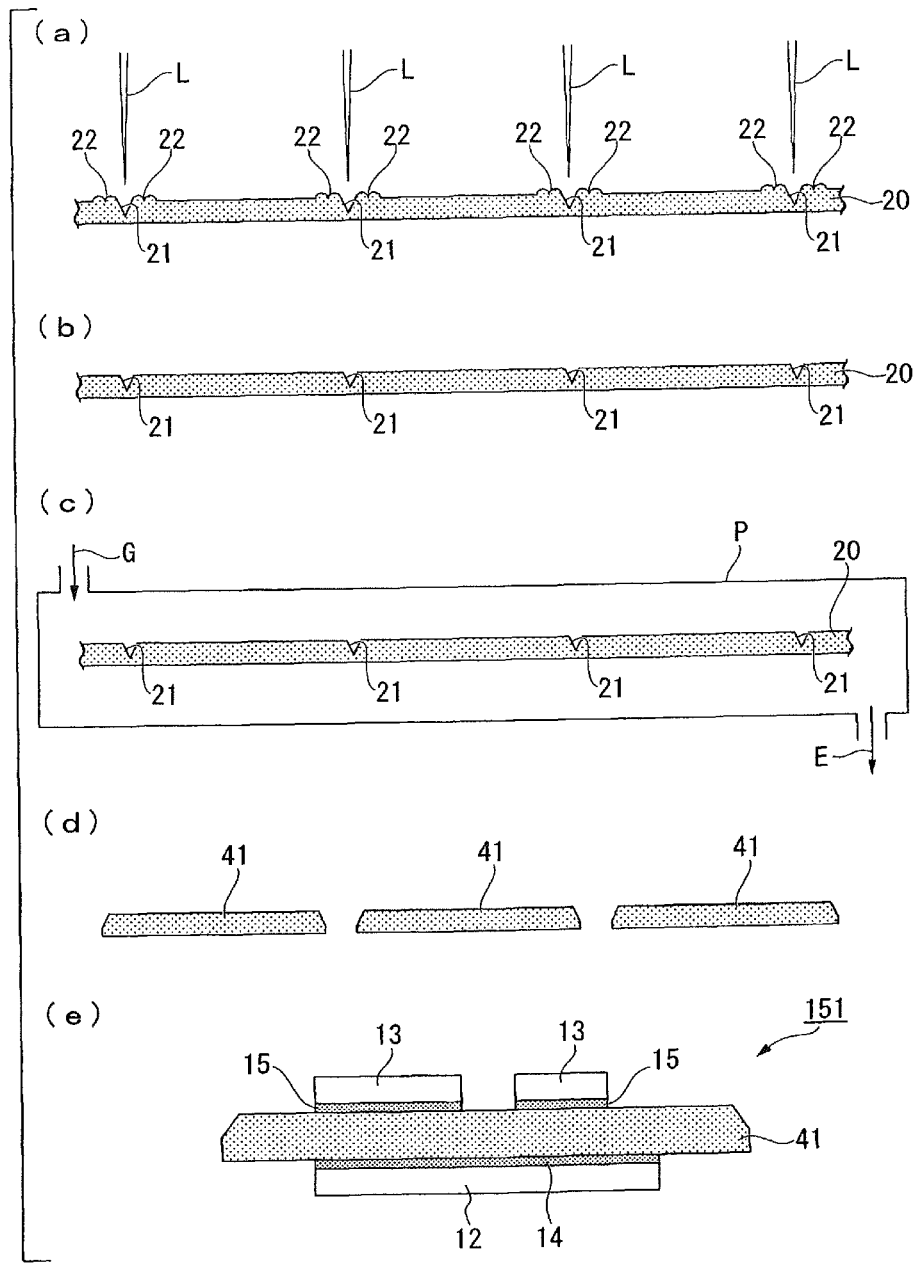
FIG. 10 is a process diagram illustrating a method of manufacturing a power module substrate according to a third embodiment of the present invention.

Then, as a first surface treatment, a blast process of blowing $ZrO_2$ (zirconium dioxide) powder to the upper and lower surfaces of the ceramic base material 20 is performed (Step (b) of FIG. 10). In this way, the upper and lower surfaces of the ceramic base material 20 are planarized, and the fumes 22 adhered to the surface of the ceramic base material 20 are removed.

Then, as a second surface treatment, the ceramic base material 20 from which the fumes 22 are removed is accommodated in a dry etching apparatus P having a container shape, and a gas G including fluoride ions is introduced into the dry etching apparatus P to perform dry etching (Step (c) of FIG. 10). The gas G is a mixture of the above-mentioned main gas, sub-gas, and carrier gas.

The gas G reacts with the silicon oxide and the silicon composite oxide in the surface of the ceramic base material 20 to be mainly changed into $SiF_4$ and NOx or COx. The silicon oxide and the silicon composite oxide are removed from the surface of the ceramic base material and are exhausted as an exhaust gas E from the dry etching apparatus P. As such, the silicon oxide and the silicon composite oxide are effectively removed from the surface of the ceramic base material 20 by dry etching.

When hydrogen is included in the gas G, $NH_4F$ or $(NH_4)_2SiF_6$ is formed in the surface of the ceramic base material 20. It is preferable that $NH_4F$ or $(NH_4)_2SiF_6$ be removed in the next step.

Although not shown in the drawings, after etching, preferably, the ceramic base material 20 is cleaned with distilled water, is dried by an air blower, is cleaned by an ultrasonic cleaning process using ethanol, and is kept in a dried atmosphere.

Then, after dry etching, the concentration of the silicon oxide and the silicon composite oxide in the surface of the ceramic base material 20 is measured by the EPMA. As a result, the concentration is reduced to 2.7 Atom % or less. The surface measurement method using the EPMA is the same as described above. The surface measurement using the EPMA is performed at any five points in each of a plurality of regions partitioned by the scribe lines 21 in the ceramic base material 20.

Then, the ceramic base material 20 is divided along the scribe lines 21 (Step (d) of FIG. 10). In this way, a ceramic substrate 41 is manufactured. The circuit layers 13 and the metal layer 12 are respectively bonded to the upper and lower surfaces of the ceramic substrate 41 by brazing (Step (e) of FIG. 10).

In this way, a power module substrate 151 is manufactured.

According to this embodiment, since the silicon oxide and the silicon composite oxide are removed from the upper and lower surfaces of the ceramic substrate 41 by dry etching, the generation of SiO (silicon monoxide) gas due to the silicon oxide and the silicon composite oxide is prevented during bonding. In this way, the bonding area of the circuit layer 13 to the ceramic substrate 41 and the bonding area of the metal layer 12 to the ceramic substrate 41 are sufficiently ensured.

In the power module substrate 151, the bonding area and strength between the metal members and the ceramic substrate 41 are sufficiently ensured. Therefore, during the temperature cycle test, for example, up to about 1000 cycles, the peeling-off from the circuit layer 13 or the metal layer 12 from the ceramic substrate 41 is prevented.

The present invention is not limited to the above-described embodiment, but various modifications and changes of the present invention can be made without departing from the scope of the present invention.

For example, in the method of manufacturing the ceramic substrate according to the third embodiment, the scribe lines 21 are provided in the sintered ceramic base material 20, and the fumes 22 generated when the scribe lines 21 are formed are removed by the blast process. However, the present invention is not limited thereto. That is, for example, instead of the scribe lines 21, a cutter may be used to cut the ceramic base material 20 into a plurality of ceramic substrates 41, and the blast process may be omitted.

In the second and third embodiments, the concentration of the silicon oxide and the silicon composite oxide in the upper and lower surfaces of each of the ceramic substrates 11 and 41 is less than or equal to 2.7 Atom %, but the present invention is not limited thereto. For example, the concentration of the silicon oxide and the silicon composite oxide in at least a region in which the metal member is bonded may be less than or equal to 2.7 Atom %. That is, the concentration of the silicon oxide and the silicon composite oxide only in a portion of the surface of the ceramic substrate 11 or 41 corresponding to the shape of the metal member to be bonded may be less than or equal to 2.7 Atom %.

In the third embodiment, the circuit layer 13 is bonded to the upper surface of the ceramic substrate 41 to which the laser light L is radiated. However, the metal layer 12 may be bonded to the lower surface of the ceramic substrate 41 to which the laser light L is radiated.

The circuit layer 13 and the metal layer 12 are bonded to the ceramic substrate 11 or 41 by brazing. However, they may be bonded to each other by other methods.

In the third embodiment, after the ceramic base material 20 is divided to form the ceramic substrate 41, the metal layer 12 and the circuit layer 13 are bonded to the ceramic substrate 41. However, at least one of the metal layer 12 and the circuit layer 13 may be bonded to the ceramic base material 20 having the scribe lines 21 formed therein, and the ceramic base material 20 may be divided to form the ceramic substrate 41.

The scribe lines 21 are formed by the radiation of laser light L to the surface of the ceramic base material 20. However, the scribe lines may be formed by the radiation of other kinds of energy light.

For example, when the scribe lines 21 are formed, a honing process other than the blast process of blowing powder may be performed as the first surface treatment.

Each of the metal layer 12 and the circuit layer 13 is made of aluminum, but it may be made of other metal materials.

In the power module substrate 101 or 151, the metal layer 12 is bonded to the lower surface of the ceramic substrate 11 or 41. However, the radiator plate 32 or the cooler 31 may be directly bonded to the lower surface of the ceramic substrate 11 or 41 without providing the metal layer 12. The cooler 31 is not limited to the water-cooled type, but may be another other liquid-cooled type or an air-cooled type.

The ceramic substrate 11 or 41 is made of $Si_3N_4$ including Si, but the present invention is not limited thereto. The ceramic substrate 11 or 41 may be made of materials other than the material including Si.

In the second and third embodiments, the dry etching gas includes at least one of carbon fluoride (for example, $C_nF_{2n+2}$ or $C_nF_{2n}$) and nitrogen fluoride (for example, $NF_3$) as the main gas and $H_2$, $SF_6$ (sulfur hexafluoride), or a rare gas as the sub-gas. However, the present invention is not limited thereto.

(Fourth Embodiment)

Figure 12:
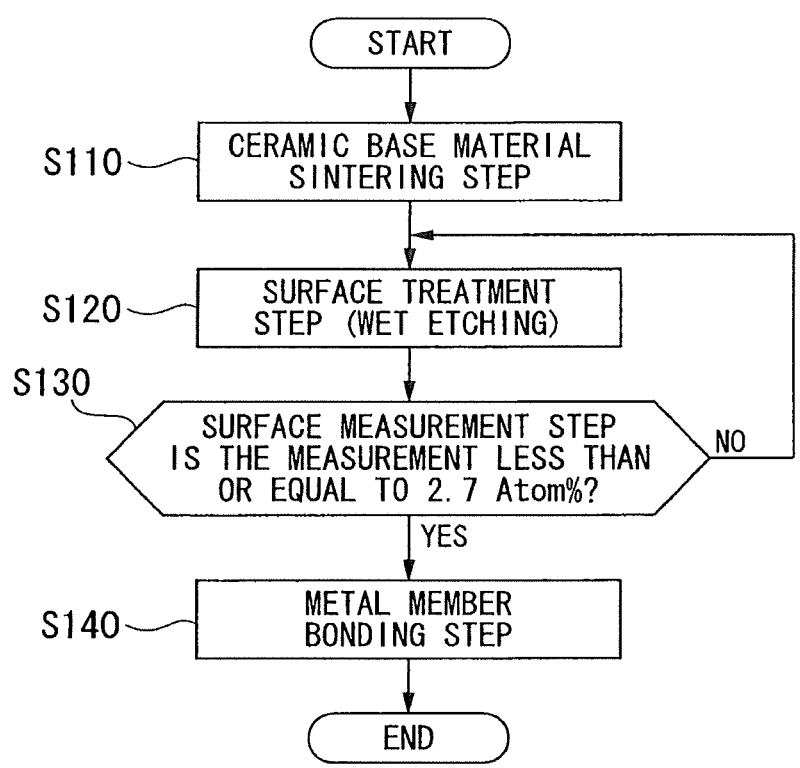
FIG. 12 is a flowchart illustrating a method of manufacturing the power module substrate according to the fourth embodiment of the present invention.

A fourth embodiment of the present invention will be described with reference to FIGS. 11 and 12. In the fourth embodiment, the same members as those in the above-described embodiments are denoted by the same reference numerals and a description thereof will be omitted.

Similar to the second embodiment, a power module substrate 101 according to this embodiment includes a ceramic substrate 11, a metal layer (metal member) 12 that is provided on the lower surface of the ceramic substrate 11, and a plurality of circuit layers (metal members) 13 that is provided on the upper surface of the ceramic substrate 11 (see FIG. 7).

The ceramic substrate 11 is made of $Si_3N_4$ (silicon nitride) and has a plate shape. The concentration of a silicon oxide and a silicon composite oxide in the upper and lower surfaces of the ceramic substrate 11 is measured by an EPMA (electron probe microanalyzer). As a result, the concentration is less than or equal to 2.7 Atom %.

The surface measurement method using the EPMA will be described with reference to FIG. 11. The quantitative analysis result shown in each table of FIG. 11 is just an illustrative example for describing the surface measurement method.

In this embodiment, JXA-8600 manufactured by JEOL LTD. is used, and the measurement is performed under the conditions of an operation pressure of $1.3 \times 10^{-3}$ Pa, an acceleration voltage of 15.0 kV, and a probe current of $5.0 \times 10^{-8}$ A. An Au film with a thickness of less than 100 nm is formed on the surface of the ceramic substrate 11 by vapor deposition.

First, the surface of the ceramic substrate 11 is quantitatively analyzed under the above-mentioned conditions (an item I of Table (a) in FIG. 11). Then, among the elements detected by the quantitative analysis, the detection amount of C (carbon) and Au (gold) is set to 0 (an item II of Table (a) in FIG. 11). The detection amounts of elements other than C and Au are converted such that the sum thereof is 100 Atom % (an item III of Table (a) in FIG. 11).

Then, it is assumed that metal elements other than Si (silicon) exist as the most common oxide and fluoride (for example, in the case of Al (aluminum), $Al_2O_3$ (alumina) and $AlF_3$ (aluminum fluoride); in the case of Y (yttrium), $Y_2O_3$ (yttrium oxide) and $YF_3$ (yttrium fluoride); in the case of Mg (magnesium), MgO (magnesium oxide) and $MgF_2$ (magnesium fluoride); in the case of Er (erbium), $Er_2O_3$ (erbium oxide) and $ErF_3$ (erbium fluoride)). When the chemical formula of the oxide of the metal element M is represented by MOx and the chemical formula of the fluoride thereof is represented by MFy, it is assumed that the ratio of the oxide and the fluoride is equal to (the converted atomic weight of O/x): (the converted atomic weight of F/y) in the unit of Atom %. In this case, the amount of O (oxygen) coupled to metal elements other than Si is calculated by the following expression (Table (b) of FIG. 11):

$$\{(\text{converted atomic weight of metal elements}) \times (\text{converted atomic weight of O})\} / \{(\text{converted atomic weight of O}) + (\text{converted atomic weight of F})\}.$$

The ratio is defined in this way because it is considered that an oxide included in a sintering agent other than $SiO_2$ also reacts with a hydrofluoric acid to form a fluoride.

Then, the difference between the converted atomic weight of O and the atomic weight of O coupled to the metal elements other than Si is calculated. A value obtained by multiplying the calculated atomic weight of O by 1.5 is used as the concentration of $SiO_2$ in the surface of the ceramic substrate 11, assuming that the calculated total amount of O is coupled to Si to form $SiO_2$. For example, in the quantitative analysis result shown in FIG. 11, the concentration of $SiO_2$ is 0.198 Atom %.

The surface measurement using the EPMA is performed at any five points on the surface of the ceramic substrate 11. In this embodiment, the surface measurement is performed at five points, but the present invention is not limited thereto. For example, the surface measurement may be performed at ten points or other multiple points.

Next, a method of manufacturing the power module substrate 101 will be described with reference to FIG. 12.

First, a ceramic base material which is made of $Si_3N_4$, is a base of the ceramic substrate 11, and has substantially the same shape as the ceramic substrate 11 is prepared, and the ceramic base material is burned (sintered) (sintering step; S110). A silicon (Si) oxide and silicon composite oxide generated during the sintering exist in the surface of the sintered ceramic base material.

Then, the ceramic base material is immersed in an etchant, which is an acid solution (hereinafter, referred to as a 'hydrofluoric acid solution') including fluoride ions. That is, wet etching is performed on the ceramic base material (surface treatment step; S120). The silicon oxide and the silicon composite oxide in the surface of the ceramic base material are effectively removed by the surface treatment step.

After the surface treatment step, the ceramic base material is cleaned in a distilled water cleaning step, is dried by an air blower in a drying step, and is cleaned in an ultrasonic cleaning step using ethanol.

Then, after the surface treatment step, the concentration of the silicon oxide and the silicon composite oxide in the surface of the ceramic base material is measured by the EPMA. As a result, the concentration is less than or equal to 2.7 Atom % (surface measurement step; S130). The surface measurement method using the EPMA is the same as described above. The surface measurement using the EPMA is performed at any five points on the surface of the ceramic base material.

If the result of the surface measurement step is less than or equal to 2.7 Atom %, the manufacture of the ceramic substrate 11 ends, and the process proceeds to the next step. If the result of the surface measurement step is more than 2.7 Atom %, the surface treatment step is performed on the ceramic base material again.

Then, the circuit layer 13 is bonded to the upper surface of the ceramic substrate 11 by brazing and the metal layer 12 is bonded to the lower surface of the ceramic substrate 11 by brazing (metal member bonding step; S140).

In this way, the power module substrate 101 is manufactured.

According to the method of manufacturing the power module substrate 101, the silicon oxide and the silicon composite oxide are removed from the upper and lower surfaces of the ceramic substrate 11 of the power module substrate 101 by wet etching in the surface treatment step. Therefore, when metal members, such as the metal layer 12 and the circuit layer 13, are bonded to the ceramic substrate 11, the generation of SiO gas from the silicon oxide and the silicon composite oxide is prevented. In this way, the bonding area of the circuit layer 13 to the ceramic substrate 11 and the bonding area of the metal layer 12 to the ceramic substrate 11 are sufficiently ensured. Therefore, it is possible to improve the reliability of the bonding between the ceramic substrate and the metal members during a thermal cycle. As a result, it is possible to prevent the metal members from peeling off from the ceramic substrate.

The surface measurement step may be omitted when the measurement result thereof is stable and is less than or equal to 2.7 Atom %.

It is more preferable that the surface treatment step be performed immediately before the metal member bonding step.

If the result of the surface measurement step is more than 2.7 Atom %, as described above, the ceramic base material may be discarded without performing the surface treatment step on the ceramic base material again. That is, it is possible to select the use of ceramic members according to various conditions and purposes.

In the power module substrate 101, the bonding area of the circuit layer 13 to the ceramic substrate 11 and the bonding area of the metal layer 12 to the ceramic substrate 11 are sufficiently ensured. Therefore, during the temperature cycle test, for example, even when a load of about 1000 cycles is applied, the peeling-off of a metal member, such as the metal layer 12 or the circuit layer 13, from the ceramic substrate 11 is prevented.

For example, similar to the second embodiment, the power module substrate 101 manufactured in this way is used in the power module 130 (see FIG. 9).

According to the ceramic substrate 11, the method of manufacturing the ceramic substrate 11, and the method of manufacturing the power module substrate 101, since wet etching is performed on the sintered ceramic base material, it is possible to sufficiently ensure the bonding area of the circuit layer 13 to the ceramic substrate 11 and the bonding area of the metal layer 12 to the ceramic substrate 11. Therefore, it is possible to improve the reliability of the bonding between the ceramic substrate and the metal members during a thermal cycle. As a result, it is possible to prevent the metal members from peeling off from the ceramic substrate.

(Fifth Embodiment)

A fifth embodiment of the present invention will be described with reference to FIG. 13. In the fifth embodiment, the same members as those in the above-described embodiments are denoted by the same reference numerals and a description thereof will be omitted.

First, a burned (sintered) ceramic base material 20 that is made of $Si_3N_4$ is prepared. A silicon (Si) oxide and silicon composite oxide generated during sintering exist in the surface of the ceramic base material 20. A plurality of scribe lines 21 is formed in one surface of the ceramic base material 20 (Step (a) of FIG. 13).

Laser light (energy light) L is radiated to one surface of the ceramic base material 20 to form the linear scribe lines 21. In this case, fumes 22 scattered from the ceramic base material 20 by the radiation of the laser light L are adhered to regions in which the scribe lines 21 are formed and around the regions. The fume 22 is also a silicon oxide and a silicon composite oxide since the ceramic base material 20 is made of $Si_3N_4$.

Figure 13:
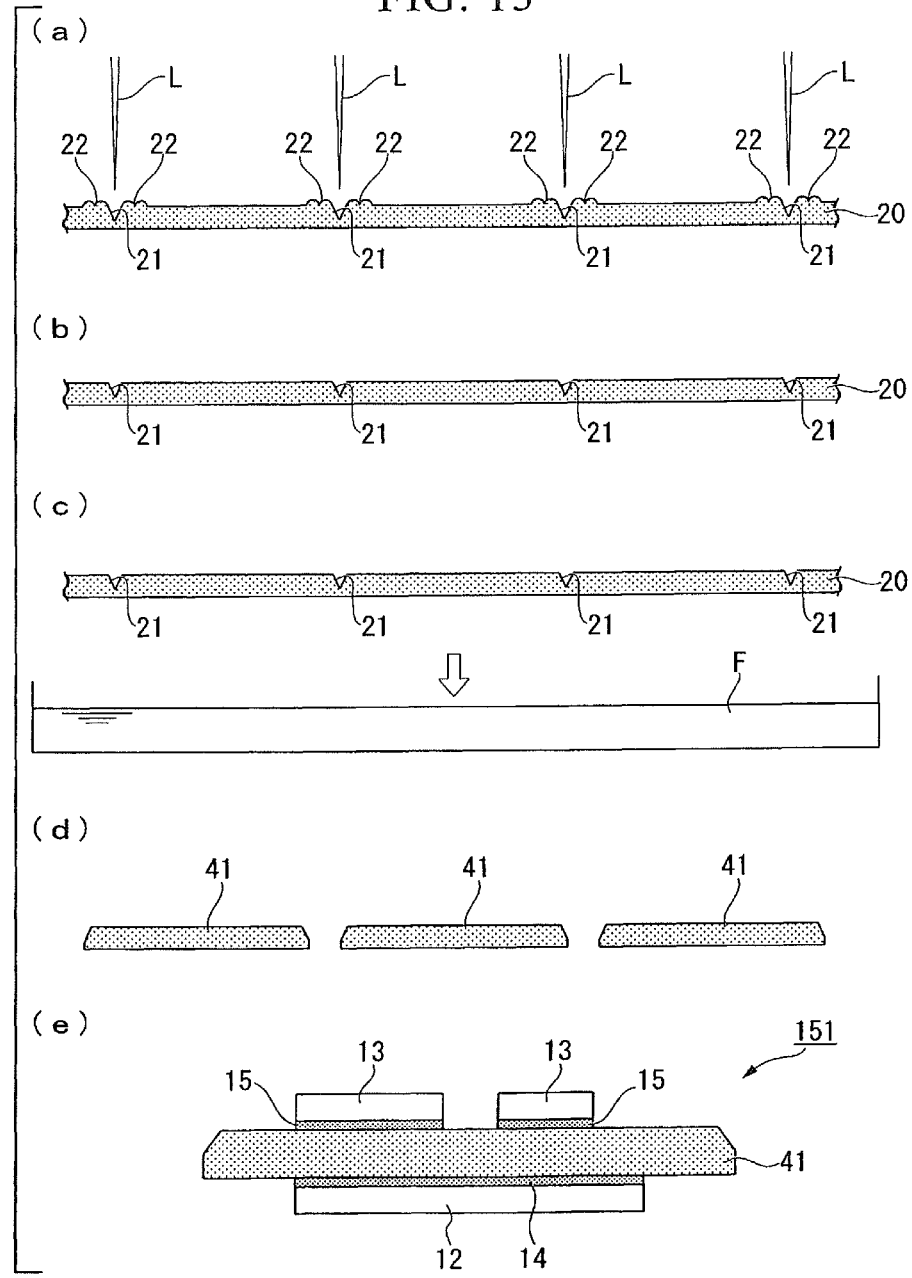
FIG. 13 is a process diagram illustrating a method of manufacturing a power module substrate according to a fifth embodiment of the present invention.

Then, as a first surface treatment, a blast process of blowing $ZrO_2$ (zirconium dioxide) powder to the upper and lower surfaces of the ceramic base material 20 is performed (Step (b) of FIG. 13). In this way, the upper and lower surfaces of the ceramic base material 20 are planarized, and the fumes 22 adhered to the surface of the ceramic base material 20 are removed.

Then, as a second surface treatment, the ceramic base material 20 from which the fumes 22 have been removed is immersed in an etchant F, which is a hydrofluoric acid solution, and wet etching is performed (Step (c) of FIG. 13). In this way, the silicon oxide and the silicon composite oxide are effectively removed from the surface of the ceramic base material 20 by wet etching.

Although not shown in the drawings, after etching, preferably, the ceramic base material 20 is cleaned with distilled water, is dried by an air blower, is cleaned by an ultrasonic cleaning process using ethanol, and is kept in a dried atmosphere.

Then, after wet etching, the concentration of the silicon oxide and the silicon composite oxide in the surface of the ceramic base material 20 is measured by the EPMA. As a result, the concentration is reduced to 2.7 Atom % or less. The surface measurement method using the EPMA is the same as described above. The surface measurement using the EPMA is performed at any five points in each of a plurality of regions partitioned by the scribe lines 21 in the ceramic base material 20.

Then, the ceramic base material 20 is divided along the scribe lines 21 (Step (d) of FIG. 13). In this way, a ceramic substrate 41 is manufactured. The circuit layers 13 and the metal layer 12 are respectively bonded to the upper and lower surfaces of the ceramic substrate 41 by brazing (Step (e) of FIG. 13).

In this way, a power module substrate 151 is manufactured.

According to this embodiment, since the silicon oxide and the silicon composite oxide are removed from the upper and lower surfaces of the ceramic substrate 41 by wet etching, the generation of SiO (silicon monoxide) gas due to the silicon oxide and the silicon composite oxide is prevented during bonding. In this way, the bonding area of the circuit layer 13 to the ceramic substrate 41 and the bonding area of the metal layer 12 to the ceramic substrate 41 are sufficiently ensured.

In the power module substrate 151, the bonding area of the circuit layer 13 to the ceramic substrate 41 and the bonding area of the metal layer 12 to the ceramic substrate 41 are sufficiently ensured. Therefore, during the temperature cycle test, for example, up to about 1000 cycles, the peeling-off from the circuit layer 13 or the metal layer 12 from the ceramic substrate 41 is prevented.

The present invention is not limited to the above-described embodiment, but various modifications and changes of the present invention can be made without departing from the scope of the present invention.

For example, in the method of manufacturing the ceramic substrate according to the fifth embodiment, the scribe lines 21 are provided in the sintered ceramic base material 20, and the fumes 22 generated when the scribe lines 21 are formed are removed by the blast process. However, the present invention is not limited thereto. That is, for example, instead of the scribe lines 21, a cutter may be used to cut the ceramic base material 20 into a plurality of ceramic substrates 41, and the blast process may be omitted.

In the fourth and fifth embodiments, the concentration of the silicon oxide and the silicon composite oxide in the upper and lower surfaces of each of the ceramic substrates 11 and 41 is less than or equal to 2.7 Atom %, but the present invention is not limited thereto. For example, the concentration of the silicon oxide and the silicon composite oxide in at least a region in which the metal member is bonded may be less than or equal to 2.7 Atom %. That is, the concentration of the silicon oxide and the silicon composite oxide only in a portion of the surface of the ceramic substrate to which the metal member is bonded may be less than or equal to 2.7 Atom % using dry etching, not wet etching, as the surface treatment process.

In the fifth embodiment, the circuit layer 13 is bonded to the upper surface of the ceramic substrate 41 to which the laser light L is radiated. However, the metal layer 12 may be bonded to the lower surface of the ceramic substrate 41 to which the laser light L is radiated.

The circuit layer 13 and the metal layer 12 are bonded to the ceramic substrate 11 or 41 by brazing. However, they may be bonded to each other by other methods.

In the fifth embodiment, after the ceramic base material 20 is divided to form the ceramic substrate 41, the metal layer 12 and the circuit layer 13 are bonded to the ceramic substrate 41. However, at least one of the metal layer 12 and the circuit layer 13 may be bonded to the ceramic base material 20 having the scribe lines 21 formed therein and the ceramic base material 20 may be divided to form the ceramic substrate 41.

The scribe lines 21 are formed by the radiation of laser light L to the surface of the ceramic base material 20. However, the scribe lines may be formed by the radiation of other kinds of energy light.

For example, when the scribe lines 21 are formed, a honing process other than the blast process of blowing powder may be performed as the first surface treatment.

Each of the metal layer 12 and the circuit layer 13 is made of aluminum, but it may be made of other metal materials.

In the power module substrate 101 or 151, the metal layer 12 is bonded to the lower surface of the ceramic substrate 11 or 41. However, the radiator plate 32 or the cooler 31 may be directly bonded to the lower surface of the ceramic substrate 11 or 41 without providing the metal layer 12.

The cooler 31 is not limited to the water-cooled type, but may be another liquid-cooled type or an air-cooled type.

The ceramic substrate 11 or 41 is made of $Si_3N_4$ including Si, but the present invention is not limited thereto. The ceramic substrate 11 or 41 may be made of materials other than the material including Si.

Example 3

Two ceramic substrates 11 that were made of $Si_3N_4$ and were manufactured by different manufacturers were pre-pared. The ceramic substrates 11 were immersed in an etchant, which is a medicinal solution adjusted by a compound ($NH_4F$ or HF) containing 4 mol/L of HF (hydrogen fluoride) and including fluoride ions $F^-$, for one hour and a hydrofluoric acid treatment was performed. After the hydrofluoric acid treatment was performed, the ceramic substrates 11 were cleaned with distilled water, were dried by an air blower, and were cleaned by an ultrasonic cleaning process using ethanol. Then, the average amount of $SiO_2$ in the surfaces of the two ceramic substrates 11 was measured by a surface measurement method using the EPMA.

Comparative Example

The same two ceramic substrates 11 were prepared, and the same process as that in Example 3 was performed on the ceramic substrates 11 except that the hydrofluoric acid process was not performed. Then, the average amounts of $SiO_2$ in the surfaces of the two ceramic substrates 11 were measured by a surface measurement method using the EPMA.

The measurement result of Example 3 and the measurement result of Comparative example are shown in the following table.

| $Si_3N_4$ substrate (ceramic substrate 11) | Example | | Comparative example | |
|---|---|---|---|---|
| | Sample 1-1 | Sample 2-1 | Sample 1-2 | Sample 2-2 |
| Hydrofluoric acid treatment | Performed | Performed | Not performed | Not performed |
| Measurement result (average $SiO_2$ concentration) | 0.42 Atom % | 1.05 Atom % | 1.02 Atom % | 4.33 Atom % |

As can be seen from the table, in Example 3, the average amounts (concentrations) of $SiO_2$ in the surfaces of the two ceramic substrates 11 (samples 1-1 and 2-1) were 0.42 Atom % and 1.05 Atom %, respectively, which were less than or equal to 2.7 Atom %. Therefore, good values were obtained.

Meanwhile, in Comparative example, the average amounts (concentrations) of $SiO_2$ in the surfaces of the two ceramic substrates 11 (samples 1-2 and 2-2) were 1.02 Atom % and 4.33 Atom %, respectively, which were more than 2.7 Atom %.

INDUSTRIAL APPLICABILITY

The present invention relates to a ceramic substrate including silicon in which the concentration of a silicon oxide and a silicon composite oxide in the surface is less than or equal to 2.7 Atom %.

According to the present invention, when metal members are bonded to the ceramic substrate, the generation of SiO gas is prevented, and sufficient bonding strength between the ceramic substrate and the metal members is ensured. Therefore, it is possible to improve the reliability of the bonding between the ceramic substrate and the metal members during a thermal cycle.

The invention claimed is:

1. A method of manufacturing a power module substrate, comprising: radiating energy light to the surface of a ceramic base material including silicon to form scribe lines in the surface of the ceramic base material; performing a surface treatment selected from a group consisting of a blast process of blowing powder, a plasma etching using gas including fluoride ions, and a reactive ion etching using gas including fluoride ions on the ceramic base material having the scribe lines formed therein; dividing the ceramic base material along the scribe lines to form a ceramic substrate; and bonding metal members to the ceramic substrate, wherein a concentration of a silicon oxide and a silicon composite oxide in the surface of the ceramic base material having the scribe lines formed therein is less than or equal to 2.7 Atom %.

2. The method of manufacturing a power module substrate according to claim 1, wherein the concentration is measured by an electron probe microanalyzer.

3. The method of manufacturing a power module substrate according to claim 1, wherein the metal members are made of aluminum.

4. The method of manufacturing a power module substrate according to claim 1, wherein the metal members are brazed to the ceramic substrate.

5. The method of manufacturing a power module substrate according to claim 1, wherein the metal members are bonded to the ceramic substrate using Al—Si-based brazing filler metal.

6. A method of manufacturing a power module substrate, comprising: radiating energy light with an energy that is greater than or equal to a second harmonic wave of a YAG laser to the surface of a ceramic base material including silicon to form scribe lines in the surface of the ceramic base material; performing a surface treatment selected from a group consisting of a blast process of blowing powder, a plasma etching using gas including fluoride ions, and a reactive ion etching using gas including fluoride ions on the ceramic base material having the scribe lines formed therein; dividing the ceramic base material along the scribe lines to form a ceramic substrate; and bonding metal members to the ceramic substrate, wherein a concentration of a silicon oxide and a silicon composite oxide in the surface of the ceramic base material having the scribe lines formed therein is less than or equal to 2.7 Atom %.

7. The method of manufacturing a power module substrate according to claim 6, wherein the concentration is measured by an electron probe microanalyzer.

8. The method of manufacturing a power module substrate according to claim 6, wherein the metal members are made of aluminum.

9. The method of manufacturing a power module substrate according to claim 6, wherein the metal members are brazed to the ceramic substrate.

10. The method of manufacturing a power module substrate according to claim 6, wherein the metal members are bonded to the ceramic substrate using Al—Si-based brazing filler metal.

* * * * *